US011306412B2

United States Patent
Fujikawa

(10) Patent No.: US 11,306,412 B2
(45) Date of Patent: Apr. 19, 2022

(54) SIC SINGLE CRYSTAL MANUFACTURING APPARATUS AND SIC SINGLE CRYSTAL MANUFACTURING METHOD

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 78 days.

(21) Appl. No.: 16/681,328

(22) Filed: Nov. 12, 2019

(65) Prior Publication Data
US 2020/0149190 A1    May 14, 2020

(30) Foreign Application Priority Data

Nov. 14, 2018 (JP) .............................. JP2018-213902

(51) Int. Cl.
*C30B 35/00* (2006.01)
*C30B 29/36* (2006.01)

(52) U.S. Cl.
CPC ........... *C30B 35/007* (2013.01); *C30B 35/002* (2013.01); *C30B 29/36* (2013.01)

(58) Field of Classification Search
CPC ....... C30B 23/00; C30B 29/36; C30B 35/002; C30B 35/007
See application file for complete search history.

(56) References Cited

FOREIGN PATENT DOCUMENTS

| CN | 201680726 U | 12/2010 |
|---|---|---|
| CN | 102308031 A | 1/2012 |
| CN | 102347258 A | 2/2012 |
| CN | 102459718 A | 5/2012 |
| CN | 102630257 A | 8/2012 |

(Continued)

OTHER PUBLICATIONS

Zhao Hongzuo et al., "Encyclopedia of Chinese Civil Engineering and Architecture Construction Equipment Engineering", Edition 1, p. 113, China Architecture & Building Press, May 1999 (3 pages).

(Continued)

*Primary Examiner* — Hua Qi
(74) *Attorney, Agent, or Firm* — Sughrue Mion, PLLC

(57) ABSTRACT

A SiC single crystal manufacturing apparatus of the present invention is a SiC single crystal manufacturing apparatus that manufactures a SiC single crystal by performing crystal growth on a growth surface of a seed crystal disposed inside a crucible, and the crucible 1 is able to accommodate a raw material M for a SiC single crystal therein, and includes a crucible lower portion 1A and a crucible upper portion 1B, the crucible lower portion including a bottom portion 1Aa and a side portion 1Ab, and the crucible upper portion including a top portion 1Ba provided with a seed crystal installation portion 1Bc for installing a seed crystal SD and a side portion 1Bb. A male thread 1AAa is provided at an outer circumference 1AA of the side portion 1Ab of the crucible lower portion 1A, a female thread 1BBa engaging with the male thread is provided at an inner circumference 1BB of the side portion 1Bb of the crucible upper portion 1B, and the crucible includes a rotation mechanism 10 that is configured to relatively move the crucible upper portion 1B and the crucible lower portion 1A in a vertical direction by rotating at least one of the crucible upper portion 1B and the crucible lower portion 1A.

1 Claim, 5 Drawing Sheets

(56) References Cited

FOREIGN PATENT DOCUMENTS

| | | | |
|---|---|---|---|
| CN | 102713028 | A | 10/2012 |
| CN | 103290476 | A | 9/2013 |
| CN | 203546203 | U | 4/2014 |
| CN | 204417639 | U | 6/2015 |
| CN | 204417652 | U | 6/2015 |
| CN | 204874827 | U | 12/2015 |
| CN | 105442038 | A | 3/2016 |
| CN | 206244929 | U | 6/2017 |
| CN | 106929919 | A | 7/2017 |
| CN | 107142520 | A | 9/2017 |
| CN | 207659559 | U | 7/2018 |
| CN | 108796610 | A | 11/2018 |
| JP | 61-213371 | A | 9/1986 |
| JP | 2000264793 | A * | 9/2000 |
| JP | 2009-23880 | A | 2/2009 |
| JP | 4924260 | B2 | 4/2012 |
| JP | 2012240906 | A * | 12/2012 |

OTHER PUBLICATIONS

Communication dated Mar. 30, 2021, issued by the State Intellectual Property Office of the P.R.C. in application No. 201911092363.1.
Communication dated Aug. 20, 2021, issued by the State Intellectual Property Office of the P.R.C. in Application No. 201911092363.1.

* cited by examiner

FIG. 1A
FIG. 1B
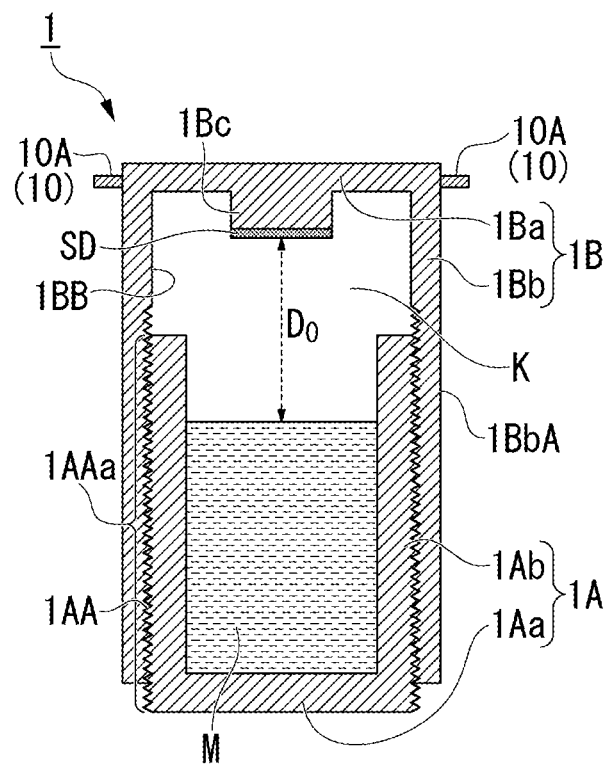
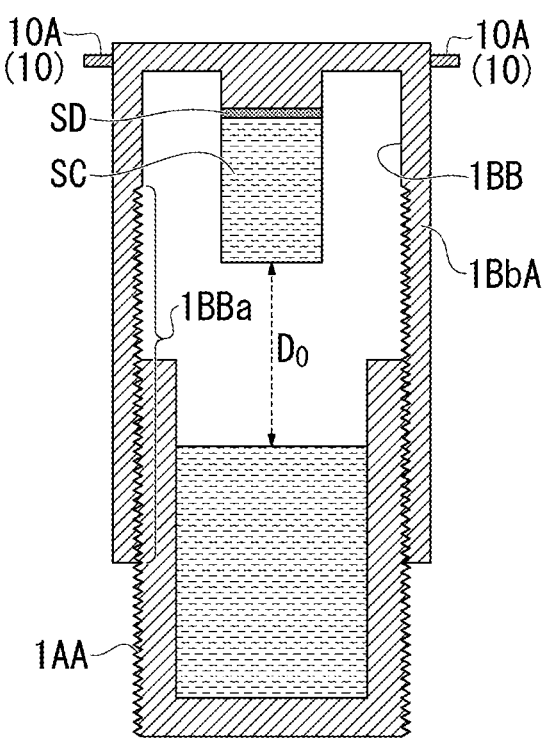

FIG. 3A
FIG. 3B
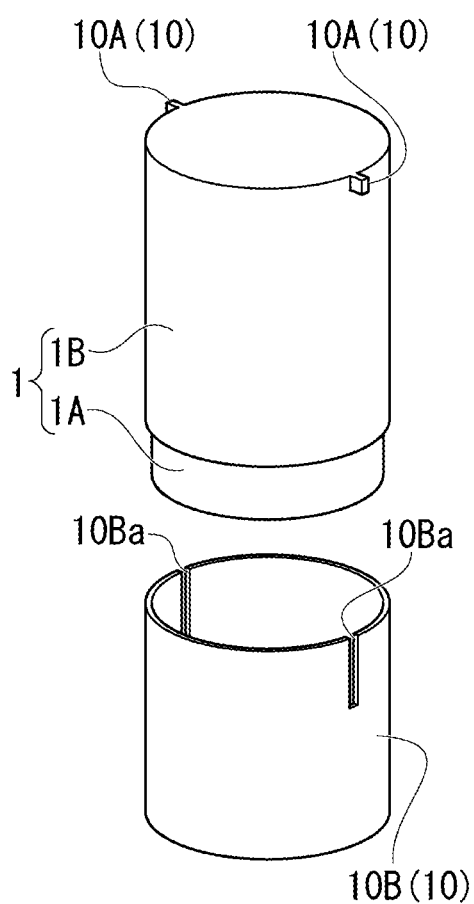
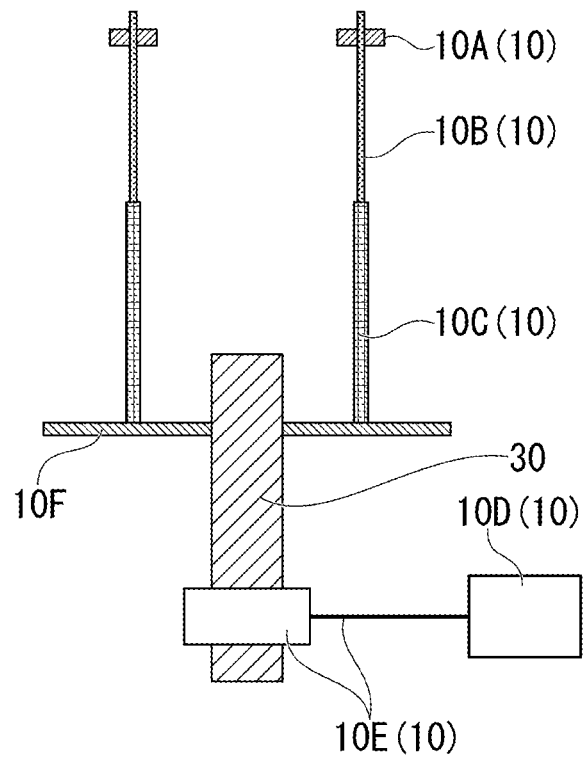

FIG. 4A
FIG. 4B
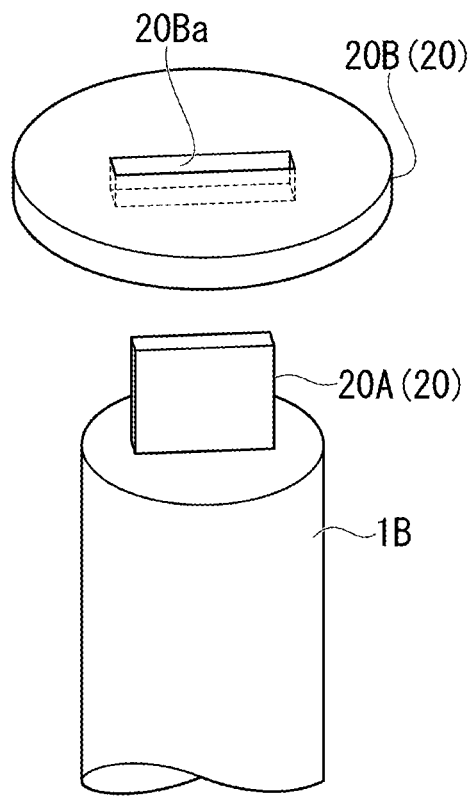
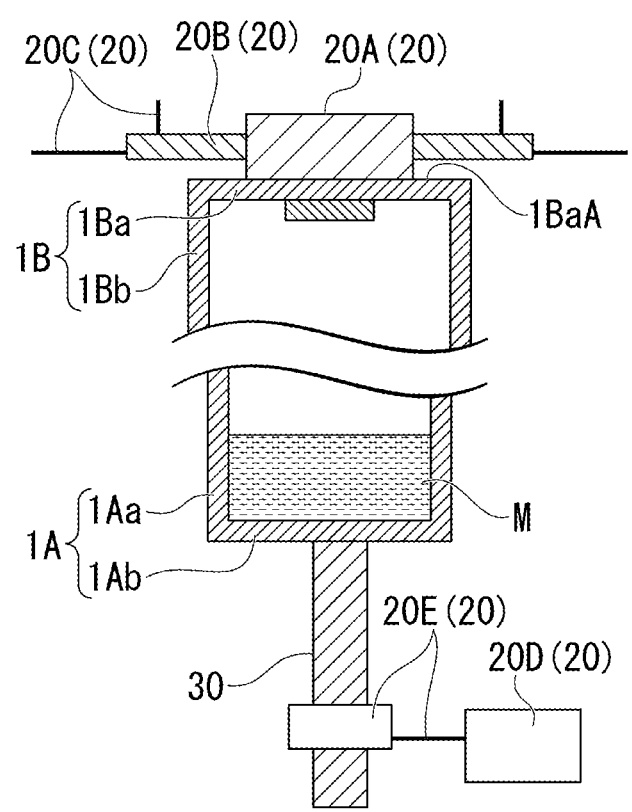

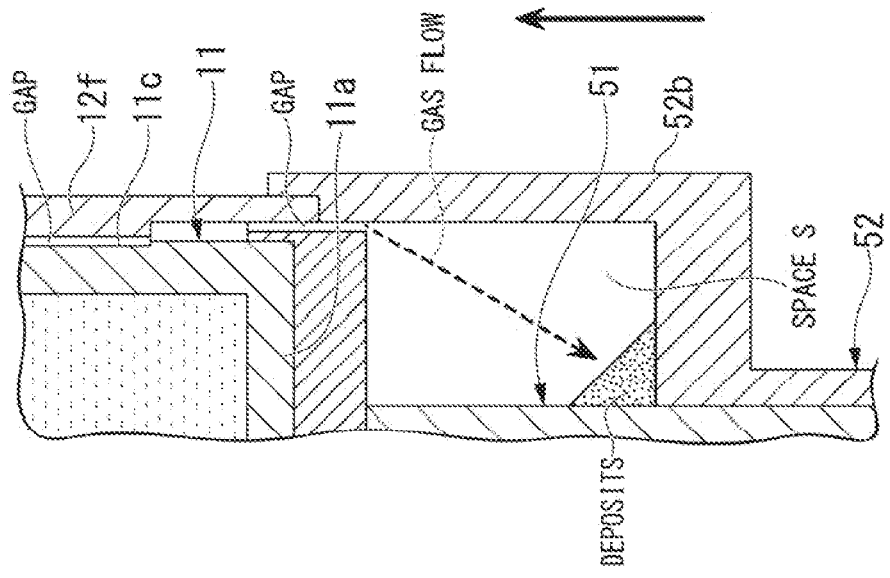
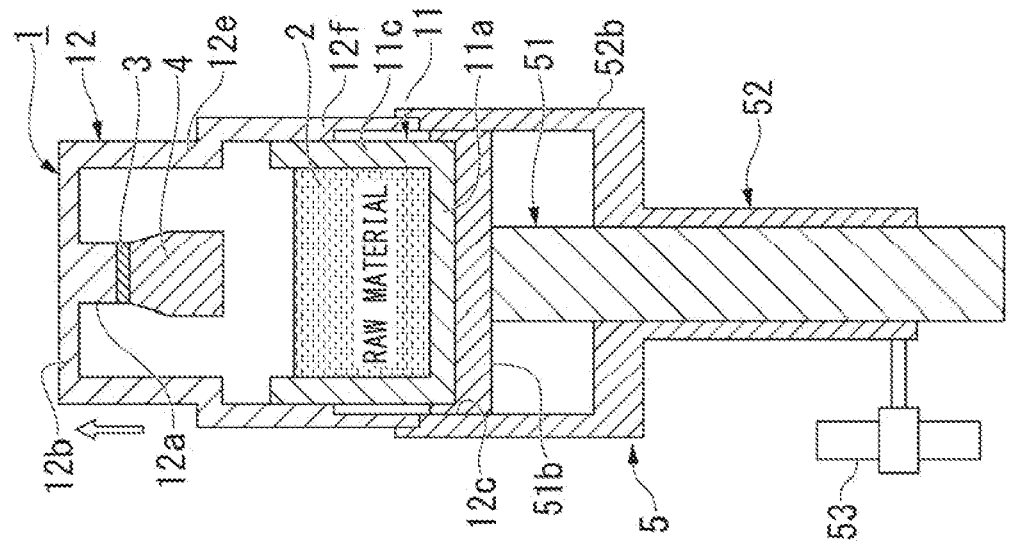
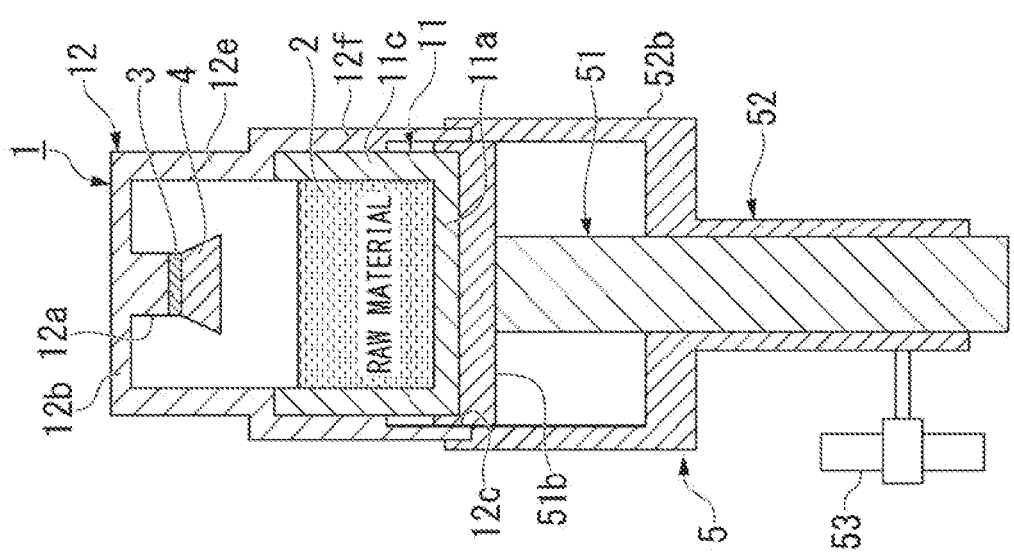

SIC SINGLE CRYSTAL MANUFACTURING APPARATUS AND SIC SINGLE CRYSTAL MANUFACTURING METHOD

BACKGROUND OF THE INVENTION

Field of the Invention

The present invention relates to a SiC single crystal manufacturing apparatus and a SiC single crystal manufacturing method.

Priority is claimed based on Japanese Patent Application No. 2018-213902, filed Nov. 14, 2018, the content of which is incorporated herein by reference.

Description of Related Art

Silicon carbide (SiC) has a dielectric breakdown electric field one order of magnitude larger and a band gap three times larger than those of silicon (Si). In addition, SiC has characteristics such as a thermal conductivity approximately three times higher than that of Si. For this reason, SiC is expected to be applied to power devices, high-frequency devices, high-temperature operating devices, and the like.

A sublimation method is widely known as one of methods of manufacturing a SiC single crystal. The sublimation method is a method of heating a silicon carbide raw material to a high temperature to generate a sublimated gas in a crucible and recrystallizing the sublimated gas on a seed crystal composed of relatively low temperature SiC single crystal to grow a SiC single crystal. In order to reduce the cost associated with crystal growth, it is desirable to increase the speed of growth and length.

PATENT DOCUMENTS

[Patent Document 1] Japanese Unexamined Patent Application, First Publication No. 2009-23880

SUMMARY OF THE INVENTION

In a sublimation method, an increase in the speed of crystal growth can be achieved by shortening a distance between a silicon carbide raw material and a seed crystal or a growth surface of a single crystal. However, since a distance decreases in association with crystal growth, it is not possible to achieve an increase in the length of a SiC single crystal.

Patent Document 1 discloses a silicon carbide single crystal manufacturing apparatus having a configuration in which a distance between a silicon carbide raw material and a growth surface can be held constant by vertically moving a crucible upper portion, out of the crucible upper portion and a crucible lower portion constituting a crucible, using a lifting apparatus, as means capable of increasing the length of a SiC single crystal.

FIGS. 5A to 5C are schematic views showing a silicon carbide single crystal manufacturing apparatus disclosed in Patent Document 1. FIG. 5A shows a configuration before a crucible upper portion 12 is pushed up, FIG. 5B shows a configuration after the crucible upper portion 12 is pushed up, and FIG. 5C is an enlarged view of the vicinity of a space surrounded by a shaft portion 51 and a shaft guide 52.

A crucible 1 includes the crucible upper portion 12 and a crucible lower portion 11. The crucible upper portion 12 includes a base 12a on which a seed crystal 3 is disposed, a bottom portion 12b, a small diameter portion 12e, and a large diameter portion 12f. On the other hand, the crucible lower portion 11 includes a bottom portion 11a and a side wall 11c.

A lifting mechanism 5 vertically moving the crucible upper portion 12 includes a shaft portion 51 that holds the crucible lower portion 11, a shaft guide 52 that vertically moves in an axial direction along a side wall surface of the shaft portion 51, and a lifting driving apparatus 53 that vertically moves the shaft guide 52. An end of the large diameter portion 12f of the crucible upper portion 12 on the opening portion 12c side is fitted into an opening end of a large diameter portion 52b of the shaft guide 52, so that the crucible upper portion 12 is fixed to the shaft guide 52, and the crucible upper portion 12 is configured to vertically move when the shaft guide 52 vertically moves.

Here, a slight gap (see FIG. 5C) is formed between an inner circumferential surface of the large diameter portion 12f of the crucible upper portion 12 and an outer circumferential surface of the side wall 11c of the crucible lower portion 11 so that the crucible upper portion 12 is vertically movable. In addition, a slight gap (see FIG. 5C) is formed between an inner circumferential surface of the large diameter portion 52b of the shaft guide 52 and an outer circumferential surface of a flange portion 51b of the shaft portion 51 so that the shaft guide 52 is vertically movable.

In a configuration disclosed in Patent Document 1 in which a distance between a silicon carbide raw material 2 and the seed crystal 3 or a growth surface of the single crystal 4 is adjusted, a raw material gas escapes through a gap (see FIG. 5C) existing between relatively moving surfaces in association with crystal growth and enters a space S surrounded by the shaft portion 51 and the shaft guide 52, and polycrystalline deposits are formed across the shaft portion 51 and the shaft guide 52. It is expected that it will be difficult to vertically move the shaft guide 52 due to the polycrystalline deposits.

The present invention is contrived in view of the above-described problem, and an object thereof is to provide a SiC single crystal manufacturing apparatus and a SiC single crystal manufacturing method which are capable of achieving both an increase in speed and an increase in length.

The present invention provides the following means in order to solve the above-described problem.

(1) A SiC single crystal manufacturing apparatus according to an aspect of the present invention is a SiC single crystal manufacturing apparatus that manufactures a SiC single crystal by performing crystal growth on a growth surface of a seed crystal disposed inside a crucible, the crucible being able to accommodate a raw material for a SiC single crystal therein and including a crucible lower portion and a crucible upper portion, the crucible lower portion including a bottom portion and a side portion, and the crucible upper portion including a top portion provided with a seed crystal installation portion and a side portion, a male thread being provided at an outer circumference of the side portion of the crucible lower portion, a female thread engaging with the male thread being provided at an inner circumference of the side portion of the crucible upper portion, and the crucible including a rotation mechanism that is configured to relatively move the crucible upper portion and the crucible lower portion in a vertical direction by rotating at least one of the crucible upper portion and the crucible lower portion.

(2) In the SiC single crystal manufacturing apparatus according to (1), the rotation mechanism may include a cylindrical body that has an inner diameter larger than an outer diameter of the crucible upper portion and has a groove portion cut from at least one of an upper end and a lower end of the cylindrical body, and a side portion protrusion portion provided at the outer circumference of the side portion of the crucible upper portion, and the rotation mechanism may rotate the crucible upper portion relative to the crucible lower portion in a state where the side portion protrusion portion is inserted into the groove portion of the cylindrical body.

(3) In the SiC single crystal manufacturing apparatus according to (1), the rotation mechanism may include a top portion protrusion portion provided on an upper surface of the top portion of the crucible upper portion, and a plate having a fitted portion which is fitted into the top portion protrusion portion, and the rotation mechanism may rotate the crucible upper portion relative to the crucible lower portion in a state where the top portion protrusion portion is inserted into the fitted portion of the plate.

(4) A SiC single crystal manufacturing method according to another aspect of the present invention is a method of manufacturing a SiC single crystal using the SiC single crystal manufacturing apparatus according to the above-described aspect, and the method includes a step of relatively moving the crucible upper portion and the crucible lower portion in a vertical direction by rotating at least one of the crucible upper portion and the crucible lower portion so that a distance between the top portion and the bottom portion is increased during growth of the SiC single crystal.

According to a SiC single crystal manufacturing apparatus of the present invention, it is possible to provide a SiC single crystal manufacturing apparatus which is capable of achieving both an increase in speed and an increase in length.

According to a SiC single crystal manufacturing method of the present invention, it is possible to provide a SiC single crystal manufacturing method which is capable of achieving both an increase in speed and an increase in length.

BRIEF DESCRIPTION OF THE DRAWINGS

FIGS. 1A and 1B are schematic cross-sectional views showing a SiC single crystal manufacturing apparatus according to an embodiment of the present invention, FIG. 1A showing a configuration before relative vertical movement of a crucible upper portion (a upper portion of a crucible) 1B and a crucible lower portion (a lower portion of a crucible) 1A, and FIG. 1B showing a configuration after relative vertical movement of the crucible upper portion 1B and the crucible lower portion 1A.

FIGS. 3A and 3B are schematic views showing an example of a rotation mechanism, FIG. 3A being a schematic perspective view showing a crucible 1 and a rotation mechanism 10, and FIG. 3B being a schematic cross-sectional view of the rotation mechanism 10.

FIGS. 4A and 4B are schematic views showing another example of a rotation mechanism, FIG. 4A being a schematic perspective view showing a crucible upper portion 1B (and a portion of a rotation mechanism 20 provided on an upper surface of the crucible upper portion), and FIG. 4B being a schematic cross-sectional view of the rotation mechanism 20 (and a portion of the crucible 1).

FIGS. 5A to 5C are schematic cross-sectional views of a silicon carbide single crystal manufacturing apparatus disclosed in Patent Document 1, FIG. 5A showing a configuration before a crucible upper portion 12 is pushed up, FIG. 5B showing a configuration after the crucible upper portion 12 is pushed up, and FIG. 5C being an enlarged view of the vicinity of a space surrounded by a shaft portion 51 and a shaft guide 52.

DETAILED DESCRIPTION OF THE INVENTION

Figure 2:
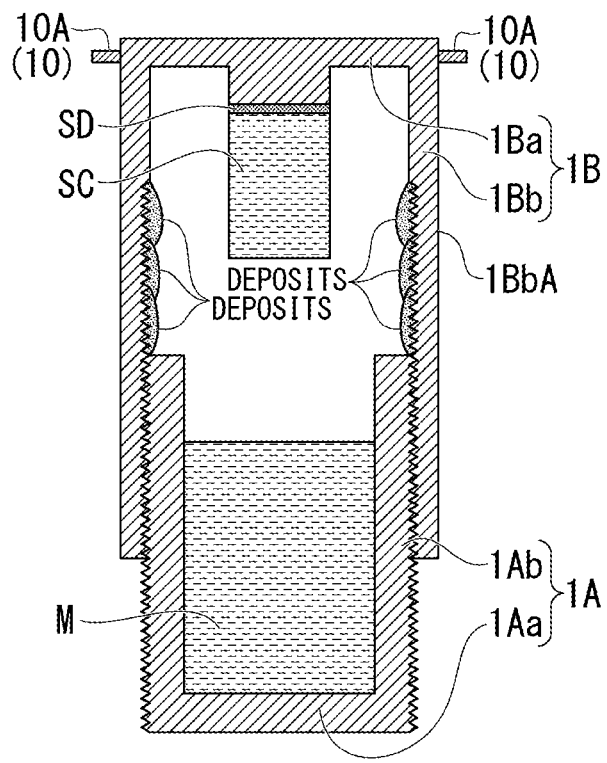
FIG. 2 is a schematic view showing deposits in a schematic cross-sectional view of the SiC single crystal manufacturing apparatus shown in FIG. 1B in order to describe the state of deposits after crystal growth.

Hereinafter, a SiC single crystal manufacturing apparatus and a SiC single crystal manufacturing method to which the present invention is applied will be described in detail with reference to the accompanying drawing as appropriate.

Meanwhile, in the drawings used in the following description, characteristic portions may be illustrated at an enlarged scale for convenience of easy understanding of characteristics of the present invention, and the dimensional ratios and the like of the respective components are not necessarily the same as the actual ones. Further, in the following description, materials, dimensions, and the like are merely exemplary examples, do not limit the present invention, and can be appropriately modified and implemented within a range in which the effects are exhibited.

(SiC Single Crystal Manufacturing Apparatus)

FIGS. 1A and 1B are schematic cross-sectional views showing a crucible included in a SiC single crystal manufacturing apparatus according to an embodiment of the present invention, FIG. 1A showing a configuration before relative vertical movement of a crucible upper portion 1B and a crucible lower portion 1A, and FIG. 1B showing a configuration after relative vertical movement of the crucible upper portion 1B and the crucible lower portion 1A.

A crucible 1 included in the SiC single crystal manufacturing apparatus of the present invention can accommodate a raw material M for a SiC single crystal therein, and includes a crucible lower portion 1A including a bottom portion 1Aa and a side portion 1Ab and a crucible upper portion 1B including a top portion 1Ba, provided with a seed crystal installation portion 1Bc for installing a seed crystal SD, and a side portion 1Bb. The crucible 1 is configured such that a male thread 1AAa is provided at an outer circumference 1AA of a side portion 1Ab of the crucible lower portion 1A and a female thread 1BBa screwed to the male thread is provided at an inner circumference 1BB of a side portion 1Bb of the crucible upper portion 1B, and the crucible 1 includes a rotation mechanism 10 (a side portion protrusion portion 10A is shown as a portion of the rotation mechanism) which vertically moves the crucible upper portion 1B and crucible lower portion 1A relative to each other by rotating at least one of the crucible upper portion 1B and the crucible lower portion 1A.

The crucible included in the SiC single crystal manufacturing apparatus of the present invention is configured such that a male thread is formed in the outer circumference of the side portion of the crucible lower portion on at least an opening end side, a female thread fitted to the female thread is formed in the inner circumference of the side portion of the crucible upper portion (crucible lid portion) on at least the opening end side, and the whole length of the crucible is increased or reduced by circulating the crucible upper portion and the crucible lower portion relative to each other.

The whole length of the crucible is shortest when a screw is tightened most, and the whole length of the crucible is longest when the screw is loosened most. In the former case, a distance between a seed crystal or a growth surface of a single crystal grown thereon and a SiC raw material is shortest. In the latter case, the distance is longest.

In a case where a SiC single crystal (ingot) is manufactured using the SiC single crystal manufacturing apparatus of the present invention, the length of the crucible in a longitudinal direction is gradually increased at the start of crystal growth, during crystal growth thereafter, and at the end of crystal growth, and thus it is possible to perform crystal growth from the start to the end of crystal growth in a state where a distance $D_0$ between the seed crystal or the growth surface of the single crystal grown thereon and the SiC raw material is not too short (for example, in a state where the distance $D_0$ is kept constant).

In addition, the crucible 1 can be the same as that known as a crucible for manufacturing a SiC single crystal by a sublimation method, except for characteristic portions of the present invention such as the male thread 1AAa and the female thread 1BBa. As a material of the crucible 1, for example, a material made of graphite or a material obtained by coating graphite with tantalum carbide can be used. Since the crucible 1 has a high temperature during growth, the crucible 1 is required to be formed of a material capable of withstanding high temperatures. For example, graphite has an extremely high sublimation temperature of 3550° C. and can withstand high temperatures during growth.

The crucible lower portion 1A can accommodate the raw material M for growing a SiC single crystal therein and includes a bottom portion 1Aa and a side portion 1Ab erected from the bottom portion 1Aa, and the male thread 1AAa is provided at the outer circumference 1AA of the side portion 1Ab.

In the crucible lower portion 1A shown in FIG. 1, the male thread 1AAa is formed on the whole surface of the outer circumference 1AA of the side portion 1Ab, but can be formed over an appropriately selected range on the basis of a relative movement range of the crucible upper portion 1B and the crucible lower portion 1A.

The crucible upper portion 1B includes a top portion 1Ba and a side portion 1Bb.

The seed crystal installation portion (base) 1Bc protruding downward is provided in a central portion on the inner side of the top portion 1Ba, and a SiC seed crystal SD is bonded to one surface (a surface on the seed crystal side) of the base 1Bc. The base 1Bc covers the crucible lower portion 1A with the crucible upper portion 1B (a lid is put on the crucible lower portion 1A) to face the raw material M for growing a SiC single crystal which is accommodated in the crucible 1. The raw material M for growing a SiC single crystal and the seed crystal SD installed at the base 1Bc face each other, and thus it is possible to efficiently supply a raw material gas to the seed crystal SD. The crucible upper portion 1B and the base 1Bc may be constituted by an integrated member or may be separate members.

It is preferable that the base 1Bc be provided at the center of the crucible upper portion 1B in a lateral direction. The base 1Bc is provided at the center of the crucible upper portion 1B in a lateral direction, and thus it is possible to make the speed of growth of the SiC single crystal SC constant in a lateral direction.

Materials of the crucible upper portion 1B and the base 1Bc are not particularly limited as long as the materials can withstand high temperatures, and the same material as that of the crucible 1 can be used.

A reaction space K where crystal growth of the SiC single crystal SC proceeds is formed by the crucible upper portion 1B and the crucible lower portion 1A. It is preferable that the reaction space K be a closed space in order to minimize waste of a raw material gas. Also in the present embodiment, the female thread 1BBa is provided at the inner circumference 1BB of the side portion 1Bb of the crucible upper portion 1B, and the male thread 1AAa is provided at the outer circumference 1AA of the side portion 1Ab of the crucible lower portion 1A, thereby realizing a closed space.

Although the pitches of the male thread 1AAa and the female thread 1BBa are not particularly limited, 3 mm to 6 mm as an example can be given as a rough estimate.

In addition, although the heights of the male thread 1AAa and female thread 1BBa and the depths of valleys corresponding thereto are not particularly limited, 3 mm to 6 mm as an example can be given as a rough estimate.

FIG. 2 is a schematic view showing deposits in a schematic cross-sectional view of the SiC single crystal manufacturing apparatus shown in FIG. 1B in order to describe the state of deposits after crystal growth. In FIG. 2, deposits are shown in only locations required for description.

During the crystal growth of SiC, raw material gases (Si, $SiC_2$, $Si_2C$, and the like) are deposited on the inner wall of the crucible 1 and in members inside the crucible 1 to form deposits. Such deposits are mainly polycrystalline deposits.

Deposits may be formed at a place where a raw material gas may enter. As shown in FIG. 2, deposits are formed on the female thread 1BBa provided at the inner circumference 1BB of the side portion 1Bb of the crucible upper portion 1B. However, a portion where deposits are substantially formed in the entire female thread 1BBa is only a portion exposed to an internal space of the crucible 1, and a relative moving direction of the crucible lower portion 1A with respect to the crucible upper portion 1B (or a moving direction of the crucible upper portion 1B with respect to the crucible lower portion 1A) is a direction of escaping from the female thread 1BBa in which deposits are formed. For this reason, the relative vertical movement between the crucible upper portion 1B and the crucible lower portion 1A is not affected.

Deposits are deposited due to a sublimated gas being saturated in a low-temperature region in the crucible. For this reason, deposits are not generated in the middle of a screw around a raw-material-filled portion which is a high-temperature region. For example, in a SiC single crystal manufacturing apparatus having a configuration shown in FIGS. 5A to 5C, a low-temperature region such as a space S is present in a lower portion of the crucible 1.

Accordingly, the sublimated gas flows through a location where the crucible lower portion 11 and the crucible upper portion 12 are fitted, and deposits are formed. On the other hand, in the SiC single crystal manufacturing apparatus 1 according to the present embodiment, deposits are deposited in a portion close to the seed crystal SD which is a low-temperature region. That is, deposits are not formed at a location where the crucible lower portion 1A and the crucible upper portion 1B, which are vicinities of a location where SiC seed crystal raw material powder M heated to a high temperature is disposed, engage with each other such that relative vertical movement between the crucible lower portion 1A and the crucible upper portion 1B is affected. Therefore, the relative vertical movement between the crucible upper portion 1B and the crucible lower portion 1A is smoothly performed, and thus it is possible to manufacture a SiC single crystal (ingot) while achieving both an increase in speed and an increase in length.

In addition, a location where the crucible upper portion and the crucible lower portion engage with each other has a structure in which the male thread 1AAa and the female thread 1BBa engage with each other and a gap between the male thread 1AAa and the female thread 1BBa has a zigzag shape, and thus a raw material gas hardly enters compared with a linear gap shown in FIGS. 5A to 5C.

FIGS. 3A and 3B are schematic views showing an example of a rotation mechanism, FIG. 3A being a schematic perspective view showing the crucible 1 and the rotation mechanism 10, and FIG. 3B being a schematic cross-sectional view of the rotation mechanism 10 (10A to 10E). In FIG. 3B, reference numeral 30 denotes a shaft that supports the crucible lower portion 1A with the center axis direction of the crucible 1 as an axial direction.

The rotation mechanism 10 includes the side portion protrusion portion 10A included in an outer circumference 1BbA of the side portion 1Bb of the crucible upper portion 1B and a cylindrical body 10B having an inner diameter larger than the outer diameter of the crucible upper portion 1B and including a groove portion 10Ba which is cut from an upper end of the cylindrical body 10B. In addition, the rotation mechanism 10 may further include rotation driving means (rotation means) 10D that rotates a shaft 30 supporting the crucible lower portion 1A.

In the example shown in FIGS. 3A and 3B, a cylindrical body support member 10C supporting the cylindrical body 10B is further included. The cylindrical body support member 10C supports a lower end of the cylindrical body 10B so that the center axis of the cylindrical body 10B coincides with the center axis of the crucible 1.

The rotation driving means 10D, which is, for example, a driving motor provided outside, is connected to the shaft 30 through connection means 10E, and the crucible lower portion 1A can be rotated through the shaft 30 by the driving of the rotation driving means 10D. The cylindrical body 10B is supported so as not rotate by a floor surface or a wall surface (reference numeral 10F in the drawing) of a furnace chamber. In this state, the shaft 30 supporting the crucible lower portion 1A is rotated in a direction in which a screw is loosened by the rotation driving means 10D.

Meanwhile, since the side portion protrusion portion 10A can be moved in only a direction of the side portion 1Bb of the cylindrical body 10B, the crucible upper portion 1B cannot rotate even when the crucible lower portion 1A rotates. As a result, the crucible lower portion 1A can be rotated in a direction in which a screw is loosened. It is possible to move the crucible upper portion 1B upward with respect to the crucible lower portion 1A by rotating the crucible lower portion 1A.

A driving speed of the rotation driving means 10D is adjusted so that the crucible upper portion 1B is moved upward with respect to the crucible lower portion 1A in response to the speed of growth of the SiC single crystal, for example, so that the distance between the surface of the raw material powder M for a SiC single crystal and a seed crystal or a growth surface of a single crystal grown on the seed crystal becomes constant.

The shape or structure of the side portion protrusion portion 10A is not particularly limited as long as the side portion protrusion portion is configured to be stably rotatable in a state where the side portion protrusion portion is inserted into the groove portion 10Ba. The same material as that of the crucible can be used as the material of the side portion protrusion portion 10A.

The same material as that of the crucible can also be used as the material of the cylindrical body support member 10C.

In the example shown in FIGS. 3A and 3B, the cylindrical body 10B is configured such that the side portion protrusion portion 10A is inserted into the groove portion 10Ba of the cylindrical body 10B from the crucible lower portion 1A side, but the cylindrical body 10B may be configured such that the side portion protrusion portion 10A is inserted into the groove portion 10Ba of the cylindrical body 10B from the crucible upper portion 1B side.

Further, in the example shown in FIGS. 3A and 3B, the number of side portion protrusion portions provided at the outer circumference of the side portion 1Bb of the crucible upper portion 1B is two, and accordingly, the number of groove portions included in the cylindrical body 10B is also two. However, the number of side portion protrusion portions and the number of groove portions associated therewith are not particularly limited.

The rotation mechanism may be configured to rotate the shaft 30 as shown in FIGS. 3A and 3B or may rotate the cylindrical body 10B.

FIGS. 4A and 4B are schematic views showing another example of a rotation mechanism. FIG. 4A is a schematic perspective view showing the crucible upper portion 1B and a top portion protrusion portion 20A (a portion of the rotation mechanism 20) provided on an upper surface 1BaA of the top portion 1Ba of the crucible upper portion 1B, a plate 20B having a fitted portion 20Ba to be fitted into the top portion protrusion portion 20A, and the like. FIG. 4B is a schematic cross-sectional view of the rotation mechanism 20 and a portion of the crucible 1.

The rotation mechanism 20 includes the top portion protrusion portion 20A and the plate 20B having the fitted portion 20Ba to be fitted into the top portion protrusion portion 20A. In addition, the rotation mechanism 20 may further include rotation driving means (rotation means) 20D.

The plate 20B is supported so as not to be rotatable by a ceiling or a wall surface of a furnace chamber by connection means 20C. In a state where the top portion protrusion portion 20A of the crucible upper portion 1B is fitted to the fitted portion 20Ba of the plate 20B, the shaft 30 fixed to the crucible lower portion 1A is rotated in a direction in which a screw is loosened by the rotation means 20D. Then, the crucible lower portion 1A rotates with respect to the crucible upper portion 1B, and the crucible upper portion 1B moves upward with respect to the crucible lower portion 1A while the plate 20B and the top portion protrusion portion 20A rub against each other in the vertical direction.

The rotation driving means 20D, which is, for example, a driving motor provided outside. A driving speed is adjusted, for example, so that the crucible upper portion 1B moves upward with respect to the crucible lower portion 1A in response to the speed of growth of a SiC single crystal so that a distance between the surface of the raw material powder M for a SiC single crystal and a seed crystal or a growth surface of a single crystal grown on the seed crystal becomes constant.

The shape or structure of the top portion protrusion portion 20A is not particularly limited as long as the top portion protrusion portion is configured to be stably rotatable in a state where the top portion protrusion portion is inserted into the fitted portion 20Ba. The same material as that of the crucible can be used as the material of the top portion protrusion portion 20A.

The same material as that of the crucible can also be used as the material of the plate 20B.

Further, in the example shown in FIGS. 4A and 4B, the number of top portion protrusion portions 20A provided on the upper surface 1BaA of the top portion 1Ba of the crucible upper portion 1B is one, and accordingly, the number of fitted portions 20Ba included in the plate 20B is also one. However, the number of top portion protrusion portions and the number of fitted portions associated therewith are not particularly limited.

The rotation mechanism may rotate the shaft 30 as shown in FIGS. 4A and 4B or may rotate the plate 20B. In a case of a configuration in which the plate 20B is rotated, the connection means 20C is not configured to support the plate 20B so that the plate 20B does not rotate.

The SiC single crystal manufacturing apparatus of the present invention can include known means and members, for example, a heat insulating material and heating means such as a high-frequency coil, in addition to the above-described crucible and rotation mechanism which are characteristic of the present invention.

(SiC Single Crystal Manufacturing Method) A SiC single crystal manufacturing method according to an embodiment of the present invention, which is a method of manufacturing a SiC single crystal using the above-described SiC single crystal manufacturing apparatus of the present invention, includes a step of relatively moving a crucible upper portion and a crucible lower portion in a vertical direction by rotating at least one of the crucible upper portion and the crucible lower portion so that a distance between a top portion and a bottom portion is increased during growth of a SiC single crystal.

EXPLANATION OF REFERENCES

1 Crucible
1A Crucible lower portion
1Aa Bottom portion
1Ab Side portion
1AA Outer circumference
1AAa Male thread
1B Crucible upper portion
1Ba Top portion
1Bb Side portion
1BaA Upper surface
1BbA Outer circumference
1BB Inner circumference
1BBa Female thread
1Bc Base
10 Rotation mechanism
10A Side portion protrusion portion
10B Cylindrical body
10Ba Groove portion
10C Cylindrical body support member
10D Rotation driving means (rotation means)
10E Connection means
20 Rotation mechanism
10F Floor surface or wall surface of furnace chamber
20A Top portion protrusion portion
20B Plate
20Ba Fitted portion
20C Connection means
20D Rotation driving means (rotation means)
20E Connection means
30 Shaft
$D_0$ Distance between growth surface of single crystal and SiC raw material
K Reaction space
M Raw material powder for SiC single crystal
SC SiC single crystal
SD SiC seed crystal

What is claimed is:

1. A SiC single crystal manufacturing apparatus that manufactures a SiC single crystal by performing crystal growth on a growth surface of a seed crystal disposed inside a crucible,
wherein the crucible is able to accommodate therein a raw material powder for growing the SiC single crystal and includes a crucible lower portion and a crucible upper portion, the crucible lower portion including a bottom portion and a side portion, and the crucible upper portion including a top portion provided with a seed crystal installation portion and a side portion,
a male thread is provided at an outer circumference of the side portion of the crucible lower portion,
a female thread engaging with the male thread is provided at an inner circumference of the side portion of the crucible upper portion, and
the crucible includes a rotation mechanism that is configured to relatively move the crucible upper portion and the crucible lower portion in a vertical direction by rotating at least one of the crucible upper portion and the crucible lower portion,
wherein the rotation mechanism includes
a cylindrical body that has an inner diameter larger than an outer diameter of the crucible upper portion and has a groove portion cut from at least one of an upper end and a lower end of the cylindrical body, and
a side portion protrusion portion provided at the outer circumference of the side portion of the crucible upper portion, and
the rotation mechanism rotates the crucible upper portion relative to the crucible lower portion in a state where the side portion protrusion portion is inserted into the groove portion of the cylindrical body.

* * * * *